(12) United States Patent
Kim

(10) Patent No.: US 7,697,346 B2
(45) Date of Patent: Apr. 13, 2010

(54) DATA INPUT/OUTPUT CIRCUIT AND METHOD OF SEMICONDUCTOR MEMORY APPARATUS

(75) Inventor: Seung-Lo Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 212 days.

(21) Appl. No.: 11/647,394

(22) Filed: Dec. 29, 2006

(65) Prior Publication Data

US 2007/0182451 A1    Aug. 9, 2007

(30) Foreign Application Priority Data

Feb. 7, 2006    (KR) .................. 10-2006-0011781

(51) Int. Cl.
*G11C 7/10*    (2006.01)

(52) U.S. Cl. .............. 365/189.05; 365/222; 365/230.03

(58) Field of Classification Search ............ 365/189.05, 365/222, 230.03, 189.04, 191, 230.08, 220, 365/221

See application file for complete search history.

(56) References Cited

U.S. PATENT DOCUMENTS 6,252,804 B1 *  6/2001  Tomita ................. 365/189.05
6,330,180 B2 * 12/2001  Noro et al. ................ 365/145
6,760,267 B2 *  7/2004  Chevallier et al. ........ 365/210.1
6,940,767 B2    9/2005  Ooishi et al.
7,046,575 B2    5/2006  Shin
2002/0093872 A1 *  7/2002  Tomita ..................... 365/233
2005/0226060 A1   10/2005  Lee et al.
2006/0023483 A1    2/2006  Lee et al.
2007/0211549 A1 *  9/2007  Kobayashi ................. 365/222

FOREIGN PATENT DOCUMENTS

JP    2006048914     2/2006
KR    10-0390820     6/2003
KR    10-0537205    12/2005

* cited by examiner

*Primary Examiner*—Dang T Nguyen
(74) *Attorney, Agent, or Firm*—Venable LLP; Jeffri A. Kaminski

(57) ABSTRACT

A first timing control unit controls an active timing of a first control signal to output a first driving control signal. A first data input/output unit transmits write data from a data input/output buffer to a global input/output line or transmits read data from the global input/output line to the data input/output buffer, in response to the first driving control signal. A second timing control unit controls an active timing of a second control signal to output a second driving control signal. A second data input/output unit transmits the write data from the global input/output line to a local input/output line or transmits the read data from the local input/output line to the global input/output line, in response to the second driving control signal.

18 Claims, 10 Drawing Sheets

DATA INPUT/OUTPUT CIRCUIT AND METHOD OF SEMICONDUCTOR MEMORY APPARATUS

BACKGROUND OF THE INVENTION

1. Technical Field

The present invention relates to data input/output circuits and methods of a semiconductor memory apparatus, in particular, to a data input/output circuit and method of a semiconductor memory apparatus that is capable of decreasing the number of global input/output lines.

2. Related Art

As semiconductor memory apparatuses migrate from SDRAM (Synchronous DRAM) into a DDR (Double Data Rate)/DDR (Double Data Rate) 2, an operation method that reads or writes data corresponding to a minimum burst length at one time for every data input/output buffer according to one read or write command in order to cope with the high frequency operation is used, which is referred to as N bit prefetch (in this case, N is the same as the minimum burst length).

For example, in the case of the DDR, the minimum burst length is 2, and 2 bit prefetch that reads or writes 2 bit data at one time for every data input buffer DQ is used. In the case of the DDR2, the minimum burst length is 4, and 4 bit prefetch that reads or writes 4 bit data at one time for every data input buffer is used.

Hereinafter, a circuit and method of inputting and outputting data of a semiconductor memory apparatus according to the related art will be described with reference to the accompanying drawing.

FIG. 1 is a block diagram of a data input/output circuit of a semiconductor memory apparatus according to the related art.

The data input/output circuit of the semiconductor memory apparatus according to the related art includes a data input/output buffer 100, a first data input/output unit 200, a first control unit 300, a second data input/output unit 400 and a second control unit 500.

The data input/output buffer 100 outputs read data to outside of the semiconductor memory apparatus or inputs write data from outside to the inside of the semiconductor memory apparatus. The first data input/output unit 200 transmits the data to be written (hereinafter write data) from the data input/output buffer 100 to a global input/output line GIO, or transmits the data to be read (hereinafter read data) from the global input/output line GIO to the data input/output buffer 100, in response to a first control signal CTRL1. The first control unit 300 outputs the first control signal CTRL1. The second data input/output unit 400 transmits the write data from the global input/output line GIO to a local input/output line LIO, or transmits the read data from the local input/output line LIO to the global input/output line GIO, in response to a second control signal CTRL2. The second control unit 500 outputs the second control signal CTRL2.

The read data refers to data read from a memory cell during a read operation, and the write data refers to data input from the data input/output buffer during a write operation.

FIG. 2 is a block diagram of the data input/output buffer 100, the first data input/output unit 200, and the first control unit 300.

The first data input/output unit 200 includes a plurality of latch units 210-0 to 210-7, a plurality of input drivers 230-0 to 230-7, a pipe latch unit 250, and an output driver 270. The plurality of latch units 210-0 to 210-7 latch the write data input in series from the data input/output buffer 100 to output in parallel, in response to input control signals IN_CTRL0 to IN_CTRL7 and an output control signal OUT_CTRL. The plurality of input drivers 230-0 to 230-7 output signals from the plurality of latch unit 210-0 to 210-7 to the global input/output lines GIO0 to GIO7 in response to an input driver control signal IN_DRV_CTRL. The pipe latch unit 250 receives the read data input in series from the global input/output lines GIO0 to GIO7. The output driver 270 outputs the read data output in parallel from the pipe latch unit 250 to the data input/output buffer 100.

The latch unit 210-$i$ includes an input unit 211-$i$ and an output unit 213-$i$. The input unit 211-$i$ receives the write data in response to the input control signal IN_CTRLi. The output unit 213-$i$ latches the write data input in the input unit 211-$i$ to output to the input driver 230-$i$ in response to the output control signal OUT_CTRL. In this case, i is an integer between 0 and 7.

The first control unit 300 outputs the input control signals IN_CTRL0 to IN_CTRL7, the output control signal OUT_CTRL and the input driver control signal IN_DRV_CTRL. The input control signals IN_CTRL0 to IN_CTRL7 control the input units 211-0 to 211-7 so that the input units 211-0 to 211-7 operate at different timings. The output control signal OUT_CTRL controls the output units 213-0 to 213-7 so that the output units 213-0 to 213-7 operate simultaneously. The input driver control signal IN_DRV_CTRL controls the input drivers 230-0 to 230-7 so that the input drivers 230-0 to 230-7 operate simultaneously.

FIG. 3 is a block diagram of the second input/output unit 400 and the second control unit 500 of the data input/output circuits shown in FIG. 1.

The second data input/output unit 400 includes a plurality of write drivers 410-0 to 410-7, a plurality of input/output sense amplifiers 430-0 to 430-7 and a plurality of read drivers 450-0 to 450-7. The plurality of write drivers 410-0 to 410-7 output the write data of the global input/output lines GIO0 to GIO7 to the local input/output lines LIO0 to LIO7 and LIOb0 to LIOb7 in response to a write driver control signal WT_DRV_CTRL. The plurality of input/output sense amplifiers 430-0 to 430-7 compare and amplify potentials of the read data of the local input/output lines LIO0 to LIO7 and LIOb0 to LIOb7 to output the results. The plurality of read drivers 450-0 to 450-7 output read data from the input/output sense amplifiers 430-0 to 430-7 to the global input/output lines GIO0 to GIO7 in response to a read driver control signal RD_DRV_CTRL.

The second control unit 500 outputs the read driver control signal RD_DRV_CTRL and the write driver control signal WT_DRV_CTRL. The read driver control signal RD_DRV_CTRL control the read drivers 450-0 to 450-7 so that the read drivers 450-0 to 450-7 are simultaneously operated. The write driver control signal WT_DRV_CTRL control the write drivers 410-0 to 410-7 so that the write drivers 410-0 to 410-7 are simultaneously operated.

The data input/output circuit is an example that is implemented in a semiconductor memory apparatus using an 8 bit prefetch.

FIG. 4 is a timing chart of a write operation of the input/output circuit shown in FIGS. 2 and 3.

When a write command WRITE0 or WRITE1 is input to the semiconductor memory apparatus, the input units 211-0 to 211-7 receive the write data from the data input/output buffer 100 in response to the input control signal IN_CTRL. The output units 213-0 to 213-7 simultaneously output the write data to the input driver 230-0 to 230-7 in response to the output control signal OUT_CTRL at a timing when the last data (for example, eighth data in the case of 8 bit prefetch) is input to the input unit 211-7. The input drivers 230-0 to 230-7 simultaneously output the write data to the global input/output lines GIO-0 to GIO-7 connected to the input drivers 230-0 to 230-7 at a rising timing of the clock signal CLOCK in response to the input driver control signal IN_DRV_CTRL. In this case, the write data changes the potential of the bit line through the write drivers 410-0 to 410-7 that operate in response to the write driver control signal WT_DRV_CTRL and the local input/output lines LIO0 to LIO7, and LIOb0 to LIOb7. The bit line sense amplifier finally stores the write data in memory cells.

FIG. 5 is a timing chart of a read operation of the data input/output circuit shown in FIGS. 2 and 3.

As shown in FIG. 5, after a read command READ0 or READ1 is input to the semiconductor memory apparatus, the input/output sense amplifiers (IOSA) 430-0 to 430-7 simultaneously operate to receive the read data from the local input/output lines LIO0 to LIO7, and LIOb0 to LIOb7, and the read drivers 450-0 to 450-7 simultaneously operate to transmit data the pipe latch unit 250 though the global input/output lines GIO-0 to GIO-7. The pipe latch unit 250 stores eight data and is synchronized with the clock signal CLOCK at a predetermined output timing to sequentially output the read data, and the output driver 270 outputs the read data to the data input/output buffer 100.

However, as described above, since the number of data that is simultaneously input to one data input/output buffer (DQ) 100 is eight, the same number of input drivers 230-0 to 230-7, write drivers 410-0 to 410-7, input/output sense amplifiers 430-0 to 430-7, read drivers 450-0 to 450-7, and global input/output lines GIO-0 to GIO-7 is required. Further, as the bit number of used prefetches is increased, the number of global input/output lines to the data input/output buffers (DQ) 100 is accordingly increased. For example, in the case of a semiconductor memory apparatus in which data is input/output to and from 16 data input/output buffers DQ from the outside of the DRAM, a total of 128 global input/output lines GIO with respect to the 8 bit prefetches and the 16 data input/output buffers DQ should be used. Further, considering development trends in semiconductor memory apparatuses, the semiconductor memory apparatus will use a larger number of prefetches needs 256 global input/output lines, which causes an increase in the total area of chips.

SUMMARY OF THE INVENTION

Embodiments of the present invention provide a circuit and a method for inputting and outputting data of a semiconductor memory apparatus that is capable of sharing the global input/output lines by separately performing the data transmission within tCCD (CAS to CAS delay) range using a data waiting time.

According to a first embodiment of the present invention, a data input/output circuit of a semiconductor memory apparatus includes a first timing control unit, a first data input/output unit, a second timing control unit and a second data input/output unit. The first timing control unit controls an active timing of a first control signal to output a first driving control signal. The first data input/output unit transmits write data from a data input/output buffer to a global input/output line or transmits read data from the global input/output line to the data input/output buffer, in response to the first driving control signal. The second timing control unit controls an active timing of a second control signal to output a second driving control signal. The second data input/output unit transmits the write data from the global input/output line to a local input/output line or transmits the read data from the local input/output line to the global input/output line, in response to the second driving control signal.

According to an embodiment of the present invention, the data input/output circuit of a semiconductor memory apparatus further includes a first control unit and a second control unit. The first control unit outputs the first control signal. The second control unit outputs the second control signal.

According to a second embodiment of the present invention, a data input/output method of a semiconductor apparatus outputs read data to a first read driver group that is half a plurality of read drivers and a second driver group that is the other half the plurality of read drivers through global input/output lines during a read operation when the read data is read out from memory cells through the plurality of read drivers. The method includes producing a first timing control signal and a second timing control signal by controlling an active timing of a read driver control signal; outputting the read data to the global input/output lines through the first read driver group in response to the first timing control signal, after a read command is input to the semiconductor memory apparatus; and outputting the read data to the global input/output lines through the second read driver group in response to the second timing control signal after a predetermined time.

According to a third embodiment of the present invention, a data input/output method of a semiconductor apparatus stores the write data in a plurality of latch units, inputs the write data to global input/output lines through a plurality of input drivers, and inputs the write data from the global input/output lines to a plurality of write drivers, during a write operation that stores write data input from a data input/output buffer in memory cells in response to an input driver control signal and a write driver control signal. The latch units are divided into a first latch unit group including half of the latch units and a second latch unit group including the other half of the latch units. The write drivers are divided into a first write driver group including half of the write drivers and a second write driver group including the other half of the write drivers. The method includes outputting the write data stored in the first latch unit group to the global input/output lines through the plurality of input drivers for a time corresponding to half a burst length in response to the input driver control signal after write command is issued; inputting the write data from the global input/output lines to the first write driver group in response to the write driver control signal; outputting the data stored in the second latch unit group to the global input/output lines through the plurality of input drivers for a time corresponding to half the burst length in response to the input driver control signal that is delayed for a predetermined time; and inputting the write data from the global input/output lines to the second write driver group in response to the delayed write driver control signal.

In a specification of DRAM (Dynamic Random Access Memory), an item of tCCD (CAS to CAS delay) is included. The tCCD is used to secure a time when data that is amplified by a bit line sense amplifier is transmitted to a local input/output line LIO and the local input/output line LIO returns to a waiting state, during a read operation, or a time when data output from a write driver is transmitted to the bit line sense amplifier through the local input/output line LIO and the local input/output line LIO returns to a waiting state, during a write operation.

That is, during repeated read or write operations, in order to normally operate the local input/output line LIO, a time of tCCD is required. On the contrary, the data transmission time by the global input/output line GIO is relatively short, and the transmission is sequentially performed while being synchronized with the external clock regardless of the prefetch. Therefore, the data that will be input or output later needs a predetermined amount of waiting time.

DESCRIPTION OF EXEMPLARY EMBODIMENT

Hereinafter, preferred embodiments of this invention will be described in detail with reference to accompanying drawings.

Figure 1:
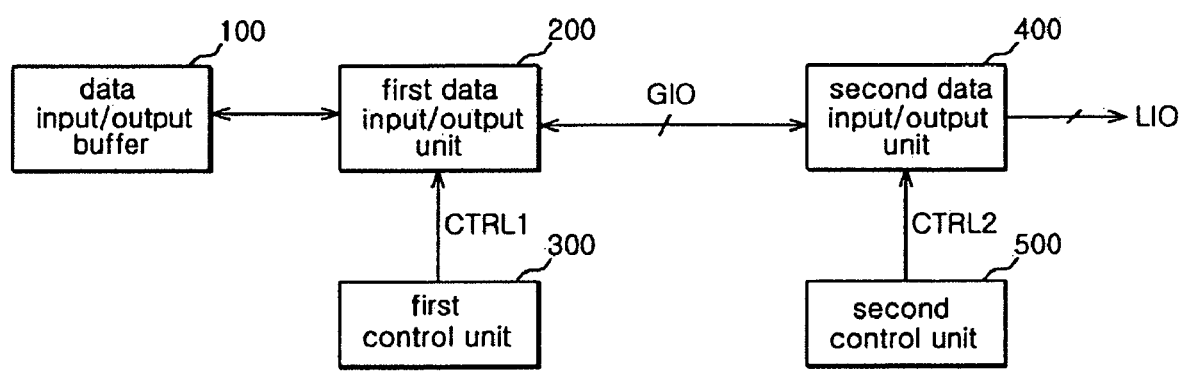
FIG. 1 is a block diagram of a data input/output circuit of a semiconductor memory apparatus according to the related art.
Figure 2:
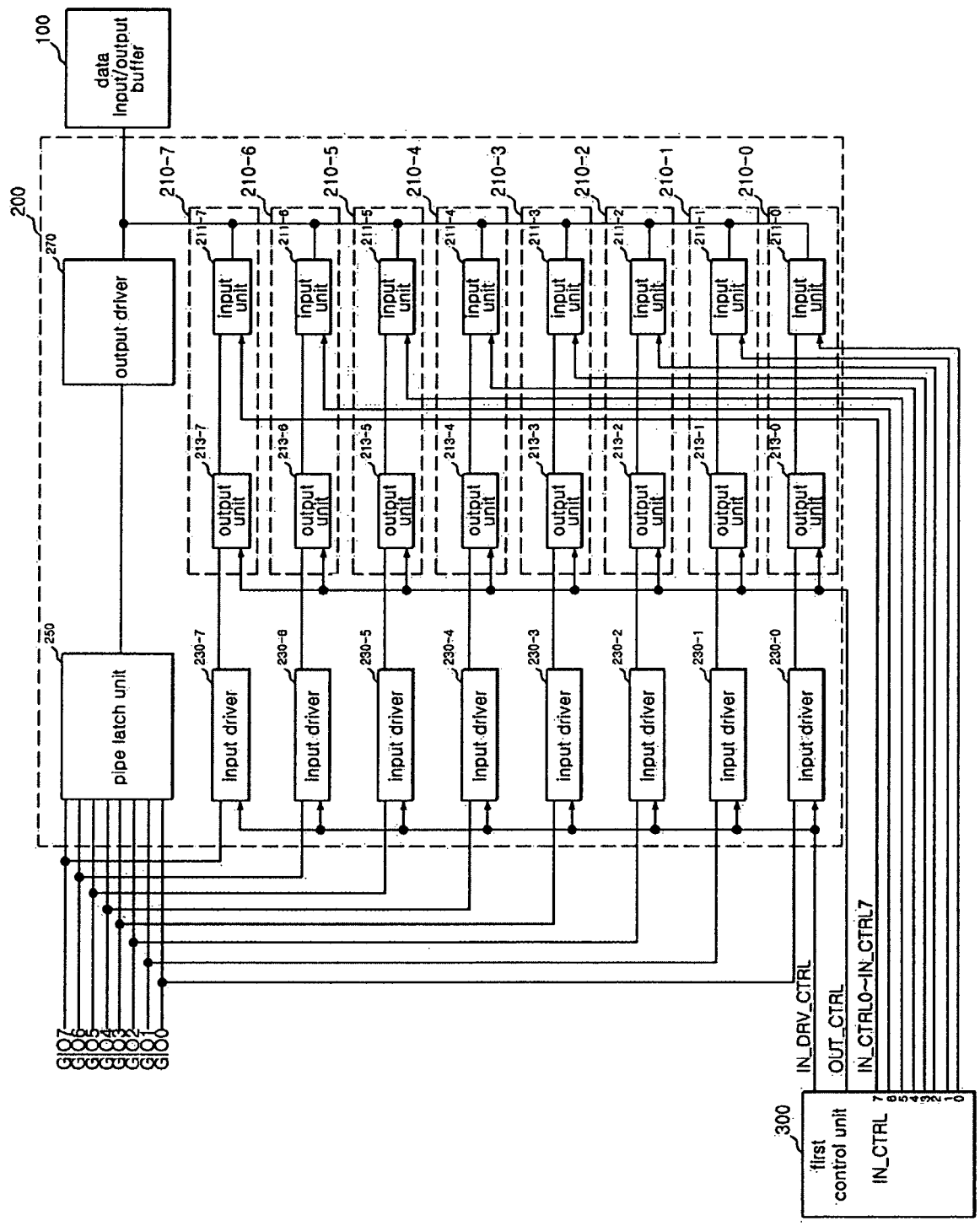
FIG. 2 is a block diagram of a data input/output buffer, a first data input/output unit, and a first control unit of the data input/output circuit shown in FIG. 1.
Figure 3:
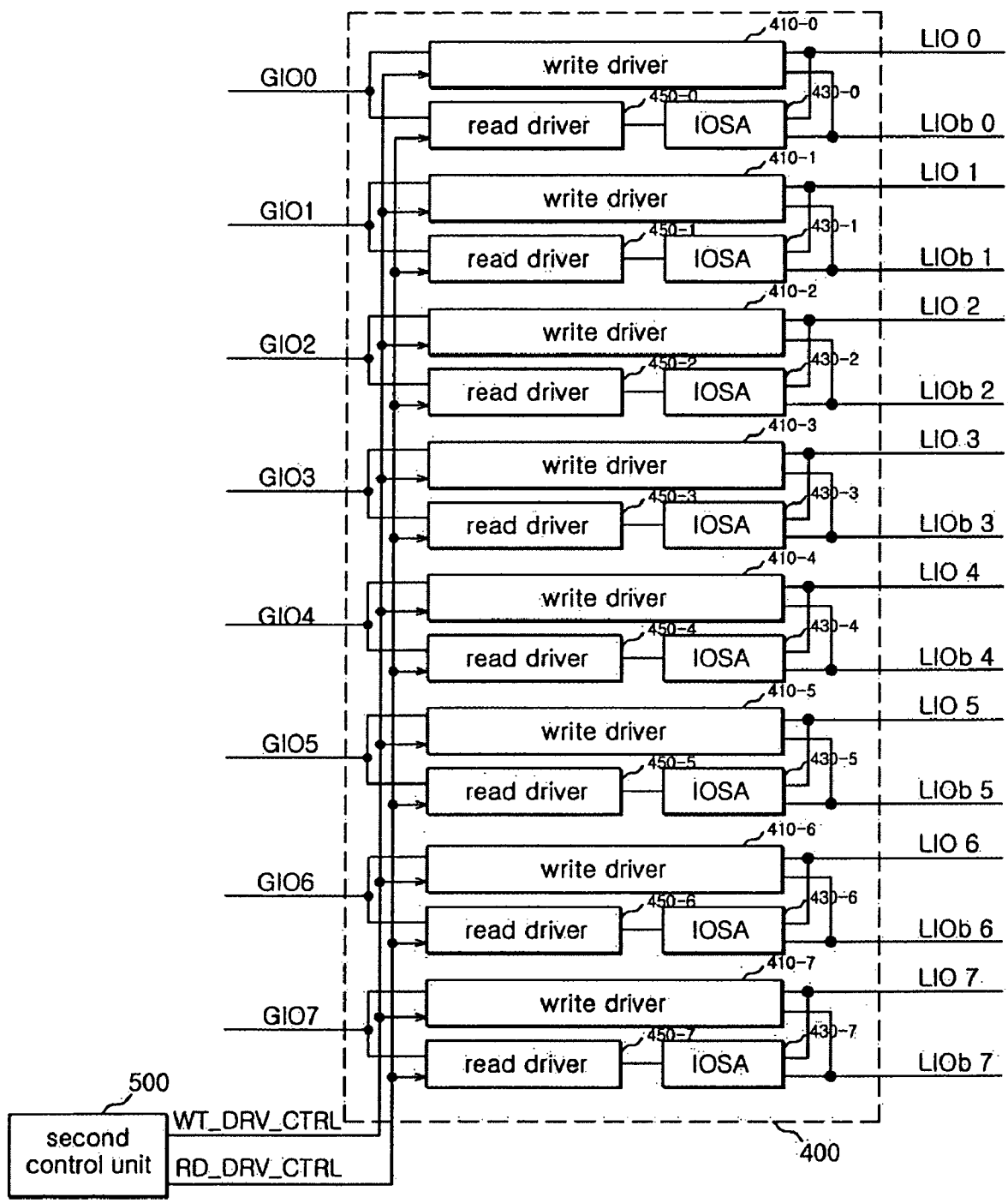
FIG. 3 is a block diagram of a second input/output unit and a second control unit of the data input/output circuits shown in FIG. 1.
Figure 4:
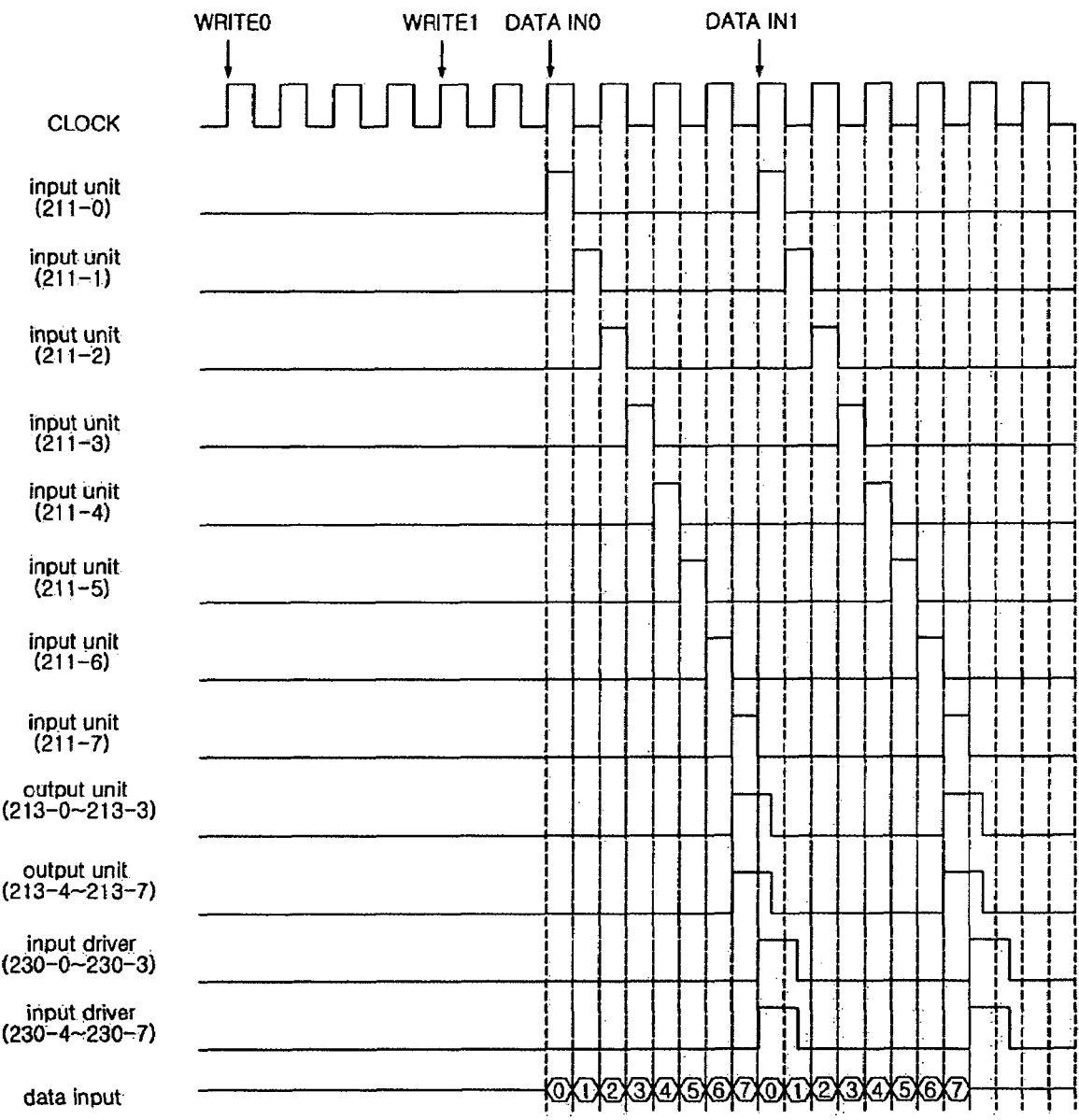
FIG. 4 is a timing chart of a write operation of the input/output circuit shown in FIGS. 2 and 3.
Figure 5:
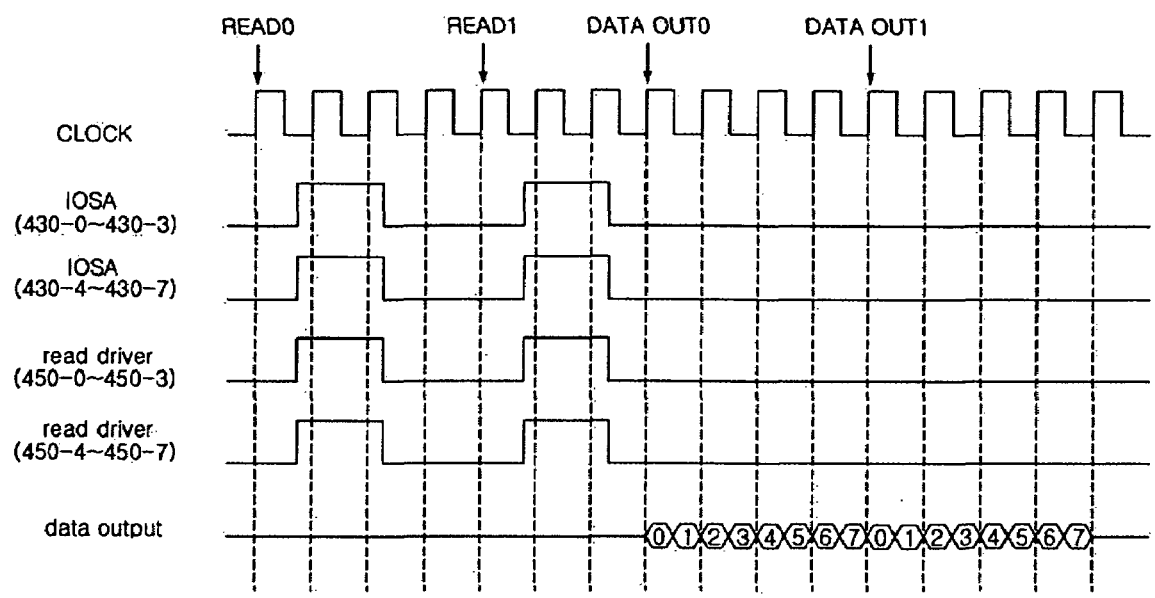
FIG. 5 is a timing chart of a read operation of the data input/output circuit shown in FIGS. 2 and 3.
Figure 6:
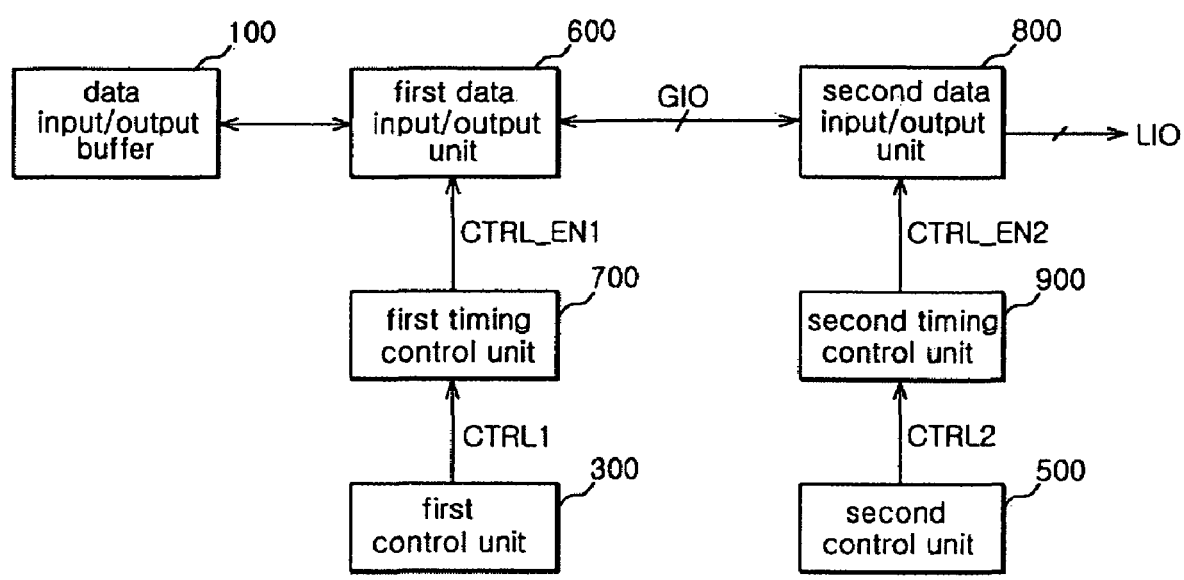
FIG. 6 is a block diagram of a data input/output circuit of a semiconductor memory apparatus according to an embodiment of the present invention.

Referring to FIG. 6, the data input/output circuit of the semiconductor memory apparatus according to an embodiment of the present invention includes a data input/output buffer 100, a first data input/output unit 600, a first timing control unit 700, a first control unit 300, a second data input/output unit 800, a second timing control unit 900 and a second control unit 500.

The data input/output buffer 100 outputs read data to the outside of the semiconductor memory apparatus (or a semiconductor memory cell), or inputs write data from the outside to the inside of the semiconductor memory apparatus (or the semiconductor memory cell). The first data input/output unit 600 transmits the write data (or data to be written) from the data input/output buffer 100 to a global input/output line GIO, or transmits the read data (or data to be read) from the global input/output line GIO to the data input/output buffer 100, in response to a first driving control signal CTRL_EN1. The first timing control unit 700 controls an active timing of a first control signal CTRL1 to output the first driving control signal CTRL_EN1. The first control unit 300 outputs the first control signal CTRL1. The second data input/output unit 800 transmits the write data from the global input/output line GIO to a local input/output line LIO, or transmits the read data from the local input/output line LIO to the global input/output line GIO, in response to a second driving control signal CTRL_EN2. The second timing control unit 900 controls an active timing of a second control signal CTRL2 to output the second driving control signal CTRL_EN2. The second control unit 500 outputs the second control signal CTRL2.

The data input/output circuit according to an embodiment of the present invention is used for the semiconductor memory apparatus using an N bit prefetch, and the number of global input/output lines is smaller than N.

The read data is read from the memory cells during a read operation, and the write data is input from the data input/output buffer during a writing operation.

Figure 7:
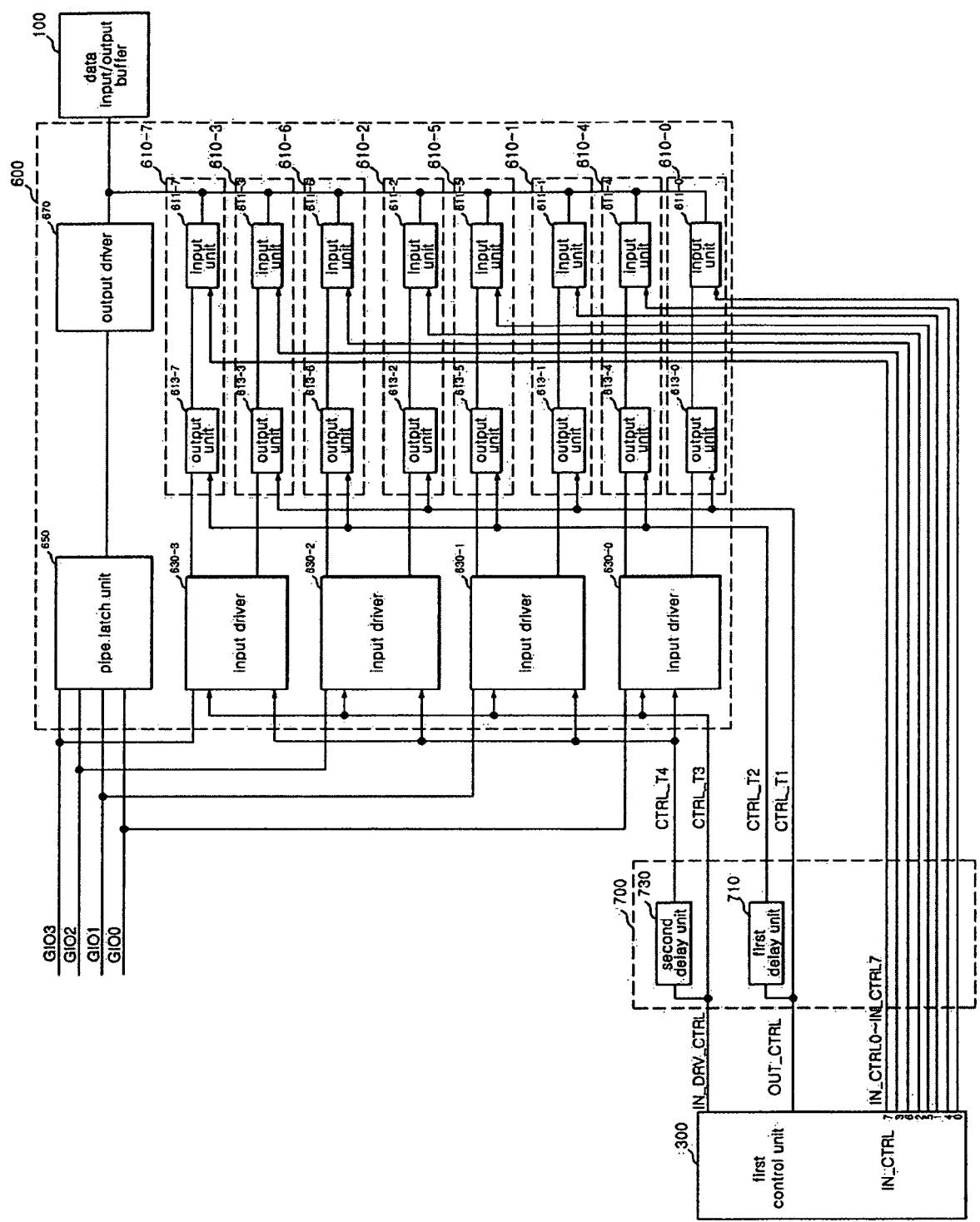
FIG. 7 is a block diagram of a data input/output buffer, a first data input/output unit, a first timing control unit, and a first control unit of the data input/output circuit shown in FIG. 6.

Referring to FIG. 7, the first data input/output unit 600 includes a plurality of latch units 610-0 to 610-7, a plurality of input drivers 630-0 to 630-3, a pipe latch unit 650 and an output driver 670. The plurality of latch units 610-0 to 610-7 latch the write data input in series from the data input/output buffer 100 to output in parallel, in response to input control signals IN_CTRL0 to IN_CTRL7, a first timing control signal CTRL_T1, and a second timing control signal CTRL_T2. The plurality of input drivers 630-0 to 630-3 output signals from the plurality of latch units 610-0 to 610-7 to the global input/output lines GIO0 to GIO3 in response to a third timing control signal CTRL_T3, and a fourth timing control signal CTRL_T4. The pipe latch unit 650 receives the read data input in series from the global input/output lines GIO0 to GIO3. The output driver 670 outputs the read data output in parallel from the pipe latch unit 650 to the data input/output buffer 100.

In the data input/output circuit of the semiconductor memory apparatus according to an embodiment of the present invention, at least two latch units share one input driver.

The latch unit 610-i includes an input unit 611-i and an output unit 613-i. The input unit 611-i receives one bit value of the write data input in response to the input control signal IN_CTRLi. The output unit 613-i latches the bit value input in the input unit 611-i for output to one of the input drivers 630-0 to 630-3 in response to the output control signal OUT_CTRL. In this case, i is an integer between 0 and 7.

The first driving control signal CTRL_EN1 includes the first timing control signal CTRL_T1, the second timing control signal CTRL_T2, the third timing control signal CTRL_T3, and the fourth timing control signal CTRL_T4.

The first timing control unit 700 includes a first delay unit 710 and a second delay unit 730.

The first timing control unit 700 outputs the output control signal OUT_CTRL as the first timing control signal CTRL_T1, outputs the input driver control signal IN_DRV_CTRL as the third timing control signal CTRL_T3, delays the output control signal OUT_CTRL through the first delay unit 710 for output as the second timing control signal CTRL_T2 and delays the input driver control signal IN_DRV_CTRL through the second delay unit 730 for output as the fourth timing control signal CTRL_T4.

The first control unit 300 outputs the input control signals IN_CTRL0 to IN_CTRL7, the output control signal OUT_CTRL and the input driver control signals IN_DRV_CTRL. The input control signals IN_CTRL0 to IN_CTRL7 control the input units 611-0 to 611-7 so that the input units 611-0 to 611-7 operate at different timings. That is, the first control signal CTRL1 includes the input control signals IN_CTRL0 to IN_CTRL7, the output control signal OUT_CTRL, and the input driver control signals IN_DRV_CTRL.

Figure 8:
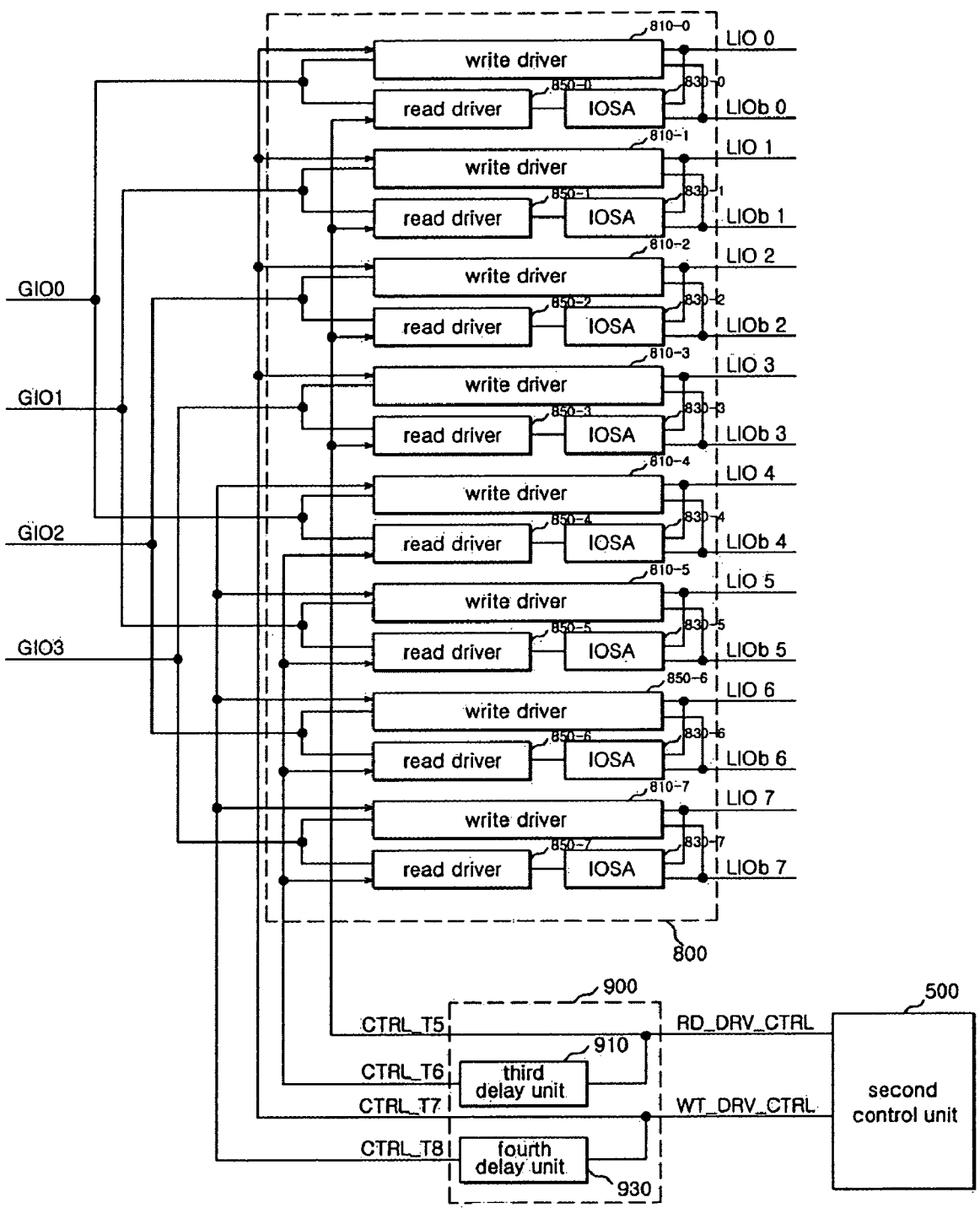
FIG. 8 is a block diagram of a second input/output unit, a second timing control unit, and a second control unit of the data input/output circuits shown in FIG. 6.

FIG. 8 is an internal block diagram illustrating the second input/output unit 800, the second timing control unit 900, and the second control unit 500 of the data input/output circuits shown in FIG. 6.

The second data input/output unit 800 includes a plurality of write drivers 810-1 to 810-7, a plurality of input/output sense amplifiers 830-0 to 830-7 and a plurality of read drivers 850-0 to 850-7. The plurality of write drivers 810-1 to 810-7 output the write data of the global input/output lines GIO0 to GIO3 to the local input/output lines LIO0 to LIO7 and LIOb0 to LIOb7 in response to a seventh timing control signal CTRL_T7 and an eighth timing control signal CTRL_8. The plurality of input/output sense amplifiers 830-0 to 830-7 receives the read data from the local input/output lines LIO0 to LIO7 and LIOb0 to LIOb7. The plurality of read drivers 850-0 to 850-7 output the read data input from the input/output sense amplifiers 830-0 to 830-7 to the global input/output lines GIO0 to GIO3 in response to a fifth timing control signal CTRL_T5 and a sixth timing control, signal CTRL_T6.

The second driving control signal CTRL_EN2 includes the fifth timing control signal CTRL_T5, the sixth timing control signal CTRL_T6, the seventh timing control signal CTRL_T7, and the eighth timing control signal CTRL_T8.

The second timing control unit 900 includes a third delay unit 910 and a fourth delay unit 930.

The second timing control unit 900 outputs the read driver control signal RD_DRV_CTRL as the fifth timing control signal CTRL_T5, outputs the write driver control signal WT_DRV_CTRL as the seventh timing control signal TRL_T7, and delays the read driver control signal RD_DRV_CTRL through the third delay unit 910 for output as the sixth timing control signal CTRL_T6, and delays the write driver control signal WT_DRV_CTRL through the fourth delay unit 930 for output as the eighth timing control signal CTRL_T8.

The second control unit 500 outputs the read driver control signal RD_DRV_CTRL and the write driver control signal WT_DRV_CTRL. The read driver control signal RD_DRV_CTRL controls a timing when the read data is output from the read drivers 850-0 to 850-7. The write driver control signal WT_DRV_CTRL controls a timing when the write data is input to the write drivers 810-0 to 810-7. That is, the second control signal CTRL2 includes the read driver control signal RD_DRV_CTRL and the write driver control signal WT_DRV_CTRL.

The data input/output circuit shown in FIGS. 7 and 8 is an exemplary embodiment of a circuit that is implemented in a semiconductor memory apparatus using an 8 bit prefetch.

Figure 9:
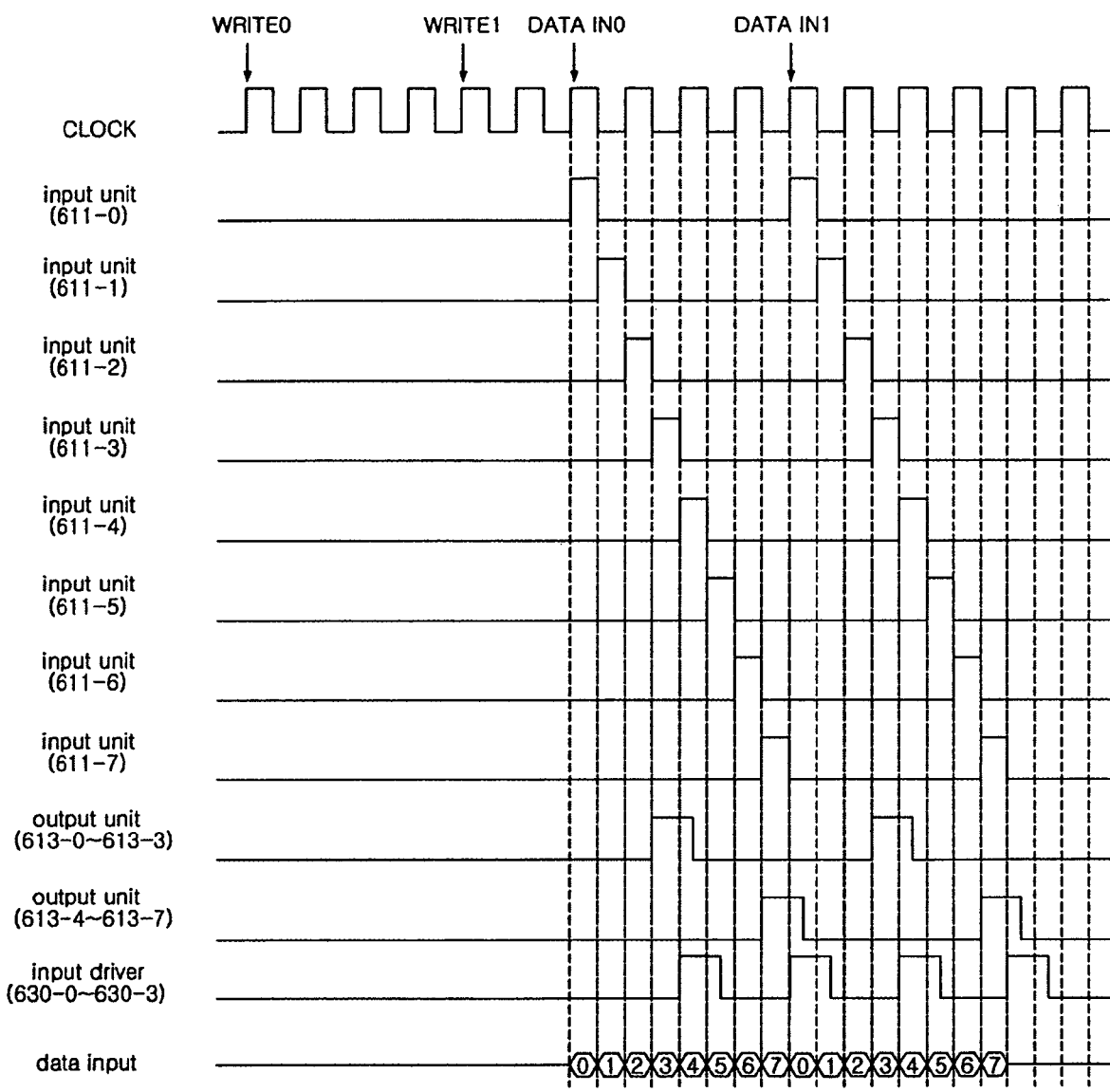
FIG. 9 is a timing chart of a write operation of the input/output circuit shown in FIGS. 7 and 8.

Referring to FIG. 9, when a write command WRITE0 or WRITE1 is input to the semiconductor memory apparatus, the input units 611-0 to 611-7 sequentially receive the write data input in series from the data input/output buffer 100 in response to the input control signals IN_CTRL0 to IN_CTRL7.

Among eight write data that are sequentially input during four clocks in the write operation, the inputs units 611-0 to 611-3 receive four write data during two clocks that is half of the burst length, and the remaining input data 611-4 to 611-7 receives the remaining four write data during the next two clocks.

In this case, the output units 613-0 to 613-3 are activated at a timing when the fourth write data is input to the input unit 611-3 in response to the first timing control signal CTRL_T1 to simultaneously output the four write data to the input drivers 630-0 to 630-3. The input drivers 630-0 to 630-3 simultaneously output the four write data to the global input/output lines GIO0 to GIO3 connected to the input drivers 630-0 to 630-3 at the rising timing of the clock signal, in response to the first timing control signal CTRL_T1. In this case, the write drivers 810-0 to 810-3 receive the four write data from the global input/output lines GIO0 to GIO3, in response to the seventh timing control signal CTRL_T7.

Further, the remaining output units 613-4 to 613-7 are activated at a timing when the eighth write data is input to the input unit 611-7 in response to the second timing control signal CTRL_T2 to simultaneously output the four write data to the input drivers 630-0 to 630-3. The input drivers 630-0 to 630-3 simultaneously output the four write data to the global input/output lines GIO0 to GIO3 connected to the input drivers 630-0 to 630-3 at the rising timing of the clock signal, in response to the second timing control signal CTRL_T2. In this case, the write drivers 810-4 to 810-7 receive the four write data from the global input/output lines GIO0 to GIO3, in response to the eighth timing control signal CTRL_T8. By using a method of simultaneously driving the eight write drivers 810-0 to 810-7 after the write data is input, it is possible to finally transmit the eight write data input from the global input/output lines GIO0 to GIO3 to the bit line sense amplifier through the local input/output lines LIO0 to LIO7.

Figure 10:
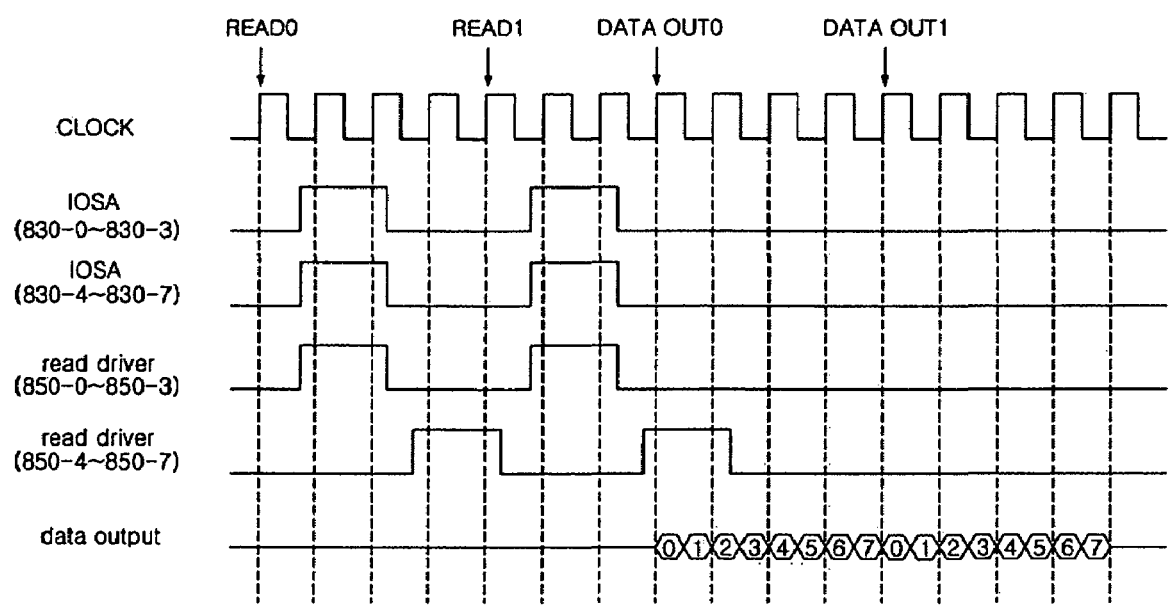
FIG. 10 is a timing chart of a read operation of the data input/output circuit shown in FIGS. 7 and 8.

Referring to FIG. 10, with respect to one data input/output buffer 500, the input/output sense amplifiers 830-0 to 830-7 that are related to the operation of the local input/output lines LIO0 to LIO7 and LIOb0 to LIOb7 during the read operation perform sensing operations at the same timing. However, the operation timings of the read drivers 850-0 to 850-7 that output the read data through the global input/output lines GIO0 to GIO3 are different from each other by respectively operating the read drivers 850-0 to 850-3 and the read drivers 850-4 to 850-7 using the fifth timing control signal CTRL_T5 and the sixth timing control signal CTRL_T6 output from the second timing control unit 900.

That is, the data input/output apparatus of the semiconductor memory according to an embodiment of this invention drives four read drivers 850-0 to 850-3 among eight read drivers 850-0 to 850-7 corresponding to 8 bit prefetches during two clocks, and drives the remaining four read drives 850-4 to 850-7 during the next two clocks. The final output of the read data is sequentially performed while being synchronized with the clock signal regardless of the prefetches. In this case, since the read data that is output later needs a predetermined waiting time, the 8 read data is transmitted to the pipe latch unit 650 using the four global input/output lines GIO0 to GIO3.

In the write operation, the input drivers 630-0 to 630-3 output the four write data that is input during the two clocks to the global input/output lines GIO0 to GIO3, and then the input drivers 630-0 to 630-3 output the remaining four write data that is input during the next two clocks to the global input/output lines GIO0 to GIO3. The write drivers 810-0 to 810-3 receive the write data from the global input/output lines GIO0 to GIO3 in response to the seventh timing control signal CTRL_T7, and the remaining write drivers 810-4 to 810-7 receive the write data from the global input/output lines GIO0 to GIO3 in response to the eighth timing control signal CTRL_T8.

As described above, by controlling the operation timings of the read drivers 850-0 to 850-3 and the read drivers 850-4 to 850-7 to be different from each other, the read drivers 850-0 to 850-3 and the read drivers 850-4 to 850-7 can share the global input/output lines GIO0 to GIO3. Further, by dividing the timing when the data related with one write command is transmitted from the input drivers 630-0 to 630-3 to the global input/output lines GIO0 to GIO3, it is possible to share the global input/output lines GIO0 to GIO3.

It will be apparent to those skilled in the art that various modifications and changes may be made without departing from the scope and spirit of the invention. Therefore, it should be understood that the above embodiment is not limiting, but illustrative in all aspects. The scope of the invention is defined by the appended claims rather than by the description preceding them, and therefore all changes and modifications that fall within metes and bounds of the claims, or equivalents of such metes and bounds are therefore intended to be embraced by the claims.

The circuit and method of inputting and outputting data of semiconductor memory apparatus according to an embodiment of the invention can reduce the current number of global data lines by ½ or more, which reduces the total area of the chips.

What is claimed is:

1. A data input/output circuit of a semiconductor memory apparatus, comprising:
    a first timing control unit configured to control an active timing of a first control signal to output a plurality of first driving control signals;
    a first data input/output unit configured to transmit write data from a data input/output buffer to a global input/output line, or transmit read data from the global input/output line to the data input/output buffer, in response to the first driving control signals;
    a second timing control unit configured to control an active timing of a second control signal to output a plurality of second driving control signals; and
    a second data input/output unit configured to transmit the write data from the global input/output line to a local input/output line, or transmit the read data from the local input/output line to the global input/output line, in response to the second driving control signals.

2. The data input/output circuit of claim 1, further comprising:
    a first control unit configured to output the first control signal; and
    a second control unit configured to output the second control signal.

3. The data input/output circuit of claim 2, wherein the first data input/output unit includes:
    a plurality of latch units configured to receive the write data and output the write data in response to the first driving control signals;
    a plurality of input drivers configured to output the write data from the latch units to the global input/output lines in response to the first driving control signals;
    a pipe latch unit to receive the read data in parallel and to output the read data in series; and
    an output driver configured to output the read data output in series from the pipe latch unit to the data input/output buffer.

4. The data input/output circuit of claim 1, wherein the first data input/output unit includes:
    a plurality of latch units configured to output the write data in response to the first driving control signals; and
    a plurality of input drivers configured to output the write data from the latch units to the global input/output line in response to the first driving control signals,
    wherein at least two latch units share one input driver.

5. The data input/output circuit of claim 3, wherein the first control signal includes an input control signal configured to control a timing when the write data is input to the latch units, an output control signal configured to control a timing when the write data is output from the latch units, and an input driver control signal configured to control the timing when the write data is output from the input drivers to the global input/output lines.

6. The data input/output circuit of claim 5, wherein the latch units include an input unit configured to receive the write data in response to the input control signal; and an output unit configured to output the write data in response to the output control signal.

7. The data input/output circuit of claim 5, wherein the first driving control signals include a first timing control signal, a second timing control signal, a third timing control signal, and a fourth timing control signal, and
    the first timing control unit includes:
    a first delay unit, and a second delay unit,
    wherein the first timing control unit is configured to output the output control signal as the first timing control signal, output the input driver control signal as the third timing control signal, delay the output control signal through the first delay unit for output as the second timing control signal, and delay the input driver control signal through the second delay unit for output as the fourth timing control signal.

8. The data input/output circuit of claim 7, wherein the first timing control signal controls the operation timing of a first latch unit group that includes half of the plurality of latch units, and the second timing control signal controls an operation timing of a second latch unit group that includes a remaining half of the latch units.

9. The data input/output circuit of claim 7, wherein the third timing control signal controls the operation timing of a first input driver group that includes half of the plurality of input drivers, and the fourth timing control signal controls the operation timing of a second input driver group that a remaining half the plurality of input drivers.

10. The data input/output circuit of claim 2, wherein the second data input/output unit includes:
    a plurality of write drivers configured to receive the write data and to output the write data from the global input/output lines to the local input/output lines in response to the second driving control signals;
    a plurality of input/output sense amplifiers configured to receive the read data from the local input/output lines; and
    a plurality of read drivers configured to output read data from the input/output sense amplifiers to the global input/output lines in response to the second driving control signals.

11. The data input/output circuit of claim 10, wherein at least two write drivers share one of the global input/output lines, and at least two read drivers share one of the global input/output lines.

12. The data input/output circuit of claim 10, wherein the second control signal includes:
    a read driver control signal for controlling a timing when the read data is output from the read driver, and a write driver control signal for controlling a timing when the write data is input to the write driver.

13. The data input/output circuit of claim 12, wherein the second driving control signals include a first timing control signal, a second timing control signal, a third timing control signal, and a fourth timing control signal, and
    the second timing control unit includes:
    a first delay unit and a second delay unit,
    the second timing control unit is configured to output the read driver control signal as the first timing control signal, output the write driver control signal as the third timing control signal, delay the read driver control signal through the first delay unit for output as the second timing control signal, and delay the write driver control signal though the second delay unit for output as the fourth timing control signal.

14. The data input/output circuit of claim 13, wherein the first timing control signal controls the operation timing of a first write driver group that includes half of the plurality of write drivers, and the second timing control signal controls the operation timing of a second write driver group that includes a remaining half of the plurality of write drivers.

15. The data input/output circuit of claim 14, wherein the first write driver group and the second write driver group share the global input/output lines.

16. The data input/output circuit of claim 13, wherein the third timing control signal controls the operation timing of a first read driver group that includes half of the plurality of read drivers, and the fourth timing control signal controls the operation timing of a second read driver group that includes a remaining half the plurality of read drivers.

17. The data input/output circuit of claim 16, wherein the first read driver group and the second read driver group share the global input/output lines.

18. The data input/output circuit of claim 1, wherein the first and second driving control signals each include a plurality of driving signals,
the driving signals composing the first driving control signals having different active timings, respectively, and
the driving signals composing the second driving control signals have different active timings, respectively.

* * * * *